United States Patent [19]
Hedtke

[11] Patent Number: 5,379,001
[45] Date of Patent: Jan. 3, 1995

[54] CLOSED LOOP LINEARIZER FOR RAMP MODULATED VCO

[75] Inventor: Neil G. Hedtke, Minnetonka, Minn.

[73] Assignee: Alliant Techsystems Inc., Edina, Minn.

[21] Appl. No.: 142,699

[22] Filed: Oct. 25, 1993

[51] Int. Cl.⁶ .............................................. H03B 23/00
[52] U.S. Cl. ....................................... 331/4; 331/178; 342/200
[58] Field of Search .................. 331/4, 178; 455/161.1, 455/161.2; 342/200; 328/184

[56] References Cited

U.S. PATENT DOCUMENTS

| | | | |
|---|---|---|---|
| 3,657,558 | 4/1972 | Patrickson | 307/228 |
| 3,783,392 | 1/1974 | Drake et al. | 328/127 |
| 4,129,832 | 12/1978 | Neal et al. | 331/178 X |
| 4,430,641 | 2/1984 | Baur et al. | 340/347 DA |
| 5,175,509 | 12/1992 | Taylor | 331/178 X |

*Primary Examiner*—Siegfried H. Grimm
*Attorney, Agent, or Firm*—Merchant, Gould, Smith, Edell, Welter & Schmidt

[57] ABSTRACT

A closed loop linearizer method and apparatus for providing a linear ramp modulation for a voltage controlled oscillator (VCO). A counter is connected to the VCO for calculating two frequency values of the oscillator at one or more time points during a ramp interval. The difference of the two frequency values is then compared with that of a predetermined ideal difference frequency value. A resulting correction value is then generated and used to adjust digital control values upward and downward, thereby causing the VCO to produce a linear modulation ramp output slope over time.

12 Claims, 5 Drawing Sheets

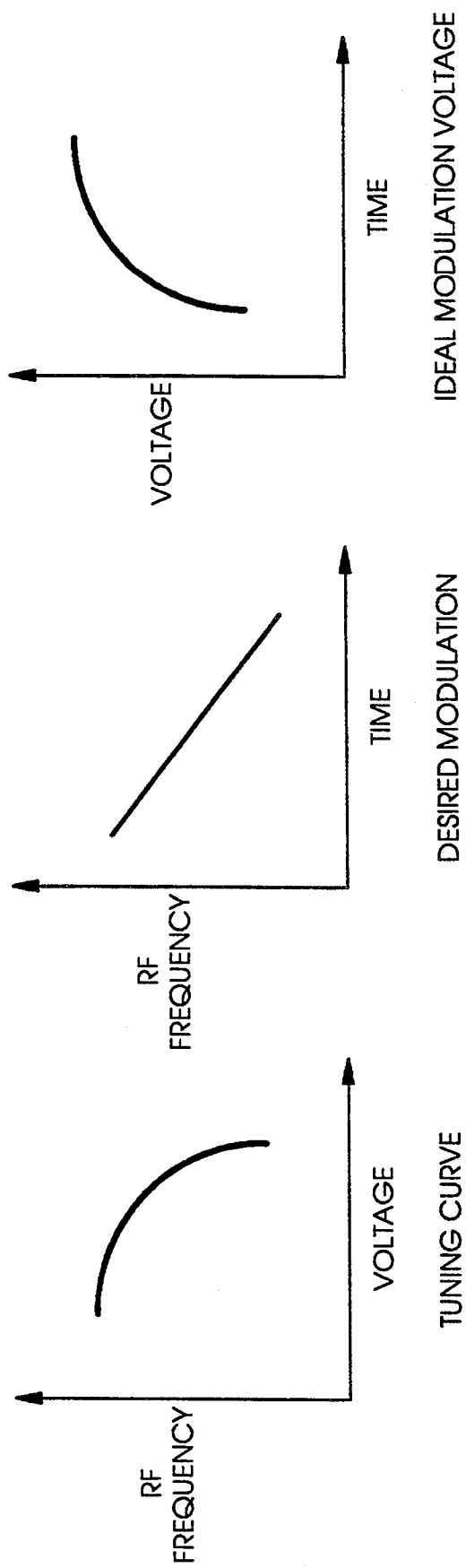

5,379,001

CLOSED LOOP LINEARIZER FOR RAMP MODULATED VCO

The Government has rights in this invention pursuant to Contract No. DAAA21-90-C-0124, awarded by the Department of the Army.

FIELD OF THE INVENTION

The present invention relates to the field of electronic radar, and more particularly to a method and apparatus for providing a highly linear ramp modulation for a voltage controlled oscillator (VCO).

BACKGROUND OF THE INVENTION

An FM/CW radar system often uses a linear frequency modulation to provide accurate range information. The resolution of the ranging information is directly dependent on the linearity of the transmit signal. However, the performance output of a VCO used to generate the radar signal is typically non-linear. Therefore, special effort must be taken to insure that the central voltage for the VCO produces the desired linear modulation ramp output slope.

A prior approach to producing a linear frequency modulation signal from a VCO uses an open loop digitally driven modulator (DDM) as shown typically in FIG. 1. The open loop approach operates by adjusting the slope of the output voltage every clock cycle to match the desired output curve. Typically, at each clock cycle a counter 103 counts clock signals from a clock 101 to select previously stored data values from a programmable read only memory (PROM) 105. These values are converted to an analog signal by a digital to analog convertor (DAC) 107. The analog signal is then typically sent through a buffer or inverter 109 and 111 to an integrator 113, where a maximum voltage corresponding to the top point in the frequency signal detected at 115, and a minimum voltage corresponding to the bottom point in the frequency signal is detected at 117. At the maximum and minimum voltages on the curve, the comparators 115 and 117 toggle the flip-flop 119. The output of the flip-flop 119, via control line 121, inverts the voltage to the integrator 113 and allows a triangle modulation. The one shot reset 123 synchronizes the counter to the output curve.

An open loop DDM has the following advantages over a standard breakpoint generator:

1) An arbitrary modulation wave form may be produced with the DDM while a breakpoint generator requires the slope of the curve to be a monotonic function.
2) For high linearity of non-linear tuning curves, the hardware complexity of the DDM is much than the breakpoint generator.
3) For volume production, the DDM is more amendable to automatic test equipment for deriving the desired tuning curve output rather than the breakpoint generator.

While the use of an open loop DDM solves a number of problems, there are still serious disadvantages with this approach. Each production unit must be individually tested and calibrated to determine its output curve and set the desired output curve function accordingly. In addition, the output curve of each production unit changes in response to operating conditions, most notably temperature, and may also change over time as the unit ages.

Therefore, there is a need for a VCO control apparatus that does not require the individual testing and calibration of each production unit. There is an additional need to provide a consistent output over a range of changing operating conditions and temperatures. There is a further need to eliminate or automatically compensate for inaccuracies which may arise in various components within the apparatus.

SUMMARY OF THE INVENTION

The present application provides for a closed loop linearizer method and apparatus for providing a linear ramp modulation for a voltage controlled oscillator (VCO). A counter is connected to the VCO for calculating two frequency values of the oscillator at one or more time points during a ramp interval. The difference of the two frequency values is then compared with that of a predetermined ideal difference frequency value. A resulting correction value is then generated and used to adjust digital control values upward and downward, thereby causing the VCO to produce a linear modulation ramp output slope over time.

BRIEF DESCRIPTION OF THE DRAWINGS

FIG. 2 is a graph diagram showing a typical VCO tuning curve compatible with the present invention.

FIG. 3 is a graph diagram showing a desired modulation curve compatible with the present invention.

FIG. 4 is a graph diagram showing an ideal modulation curve compatible with the present invention.

DETAILED DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

In a particular instance of interest to the assignee of the present invention, Alliant Techsystems Inc., the present invention is used to modulate a radar used in airborne applications. For the purpose of this description, the frequency modulation described throughout the specification and figures is a descending sawtooth form. However, it will be recognized that other frequency modulation forms such as a triangle form may be substituted and used with the present invention without loss of generality.

FIG. 2 shows a graph of a typical VCO tuning response curve. As the control voltage to the VCO is increased linearly, the output frequency typically decreases in a non-linear fashion. As can be seen from FIG. 2, as the voltage increases the change in output frequency becomes greater. A typical desired linear output frequency is shown in FIG. 3, which illustrates a linear frequency change over time. In order to produce the desired linear output frequency of FIG. 3 with the typical curve characteristic of FIG. 2, an ideal modulation voltage curve over time such as is shown in FIG. 4 is used. Initially, the voltage increases at a large rate over time in order to compensate for the lesser response of the VCO at low voltages, but as the VCO becomes more responsive at higher voltages, the rate of voltage change decreases over time.

Figure 1:
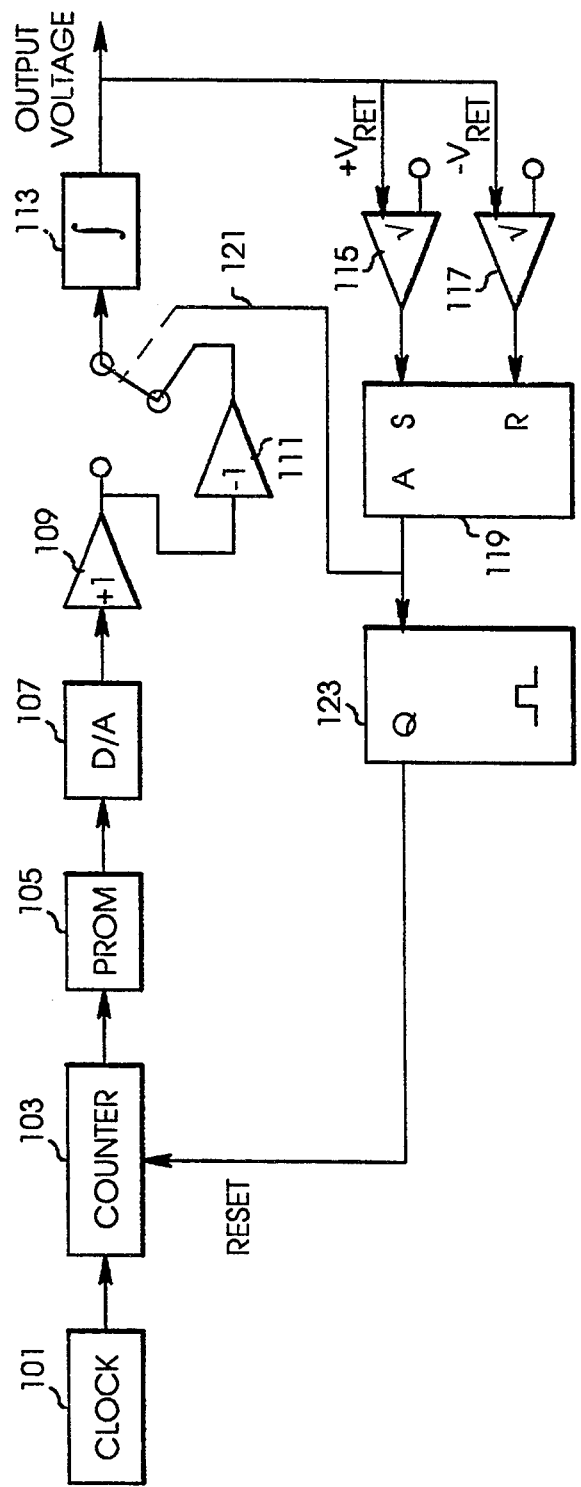
FIG. 1 is a block diagram showing the high level architecture of a typical open loop DDM circuit.
Figure 6:
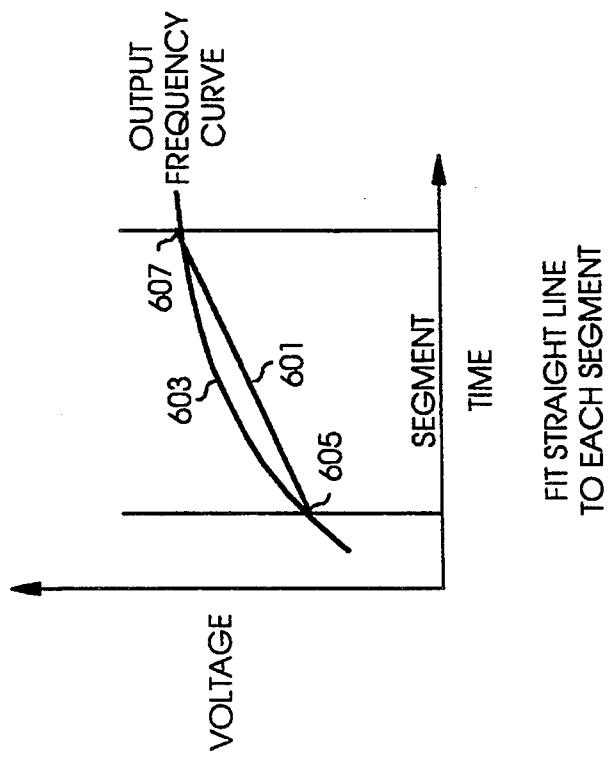
FIG. 6 is a graph diagram showing a fitted modulation voltage curve segment compatible with the present invention.
Figure 5:
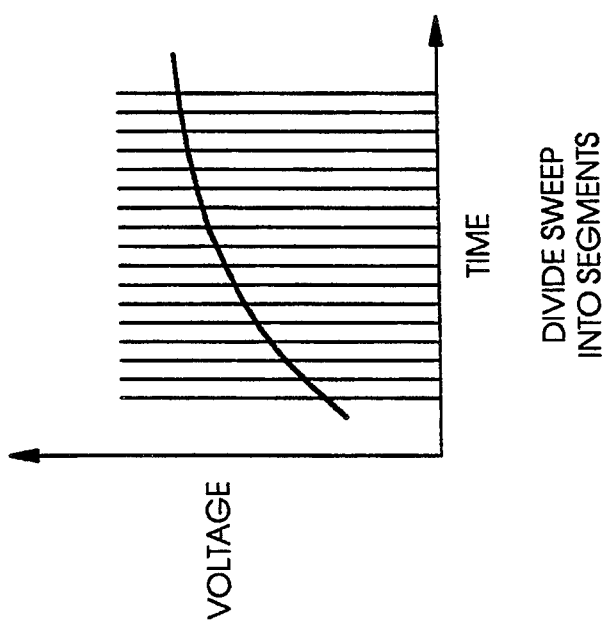
FIG. 5 is a graph diagram showing a modulation voltage curve divided into time segments compatible with the present invention.

The preferred embodiment of the present invention provides a closed loop DDM feedback system for automatically adjusting the VCO control voltage to maintain a linear VCO output frequency. The DDM divides the radar sweep into a series of equal time segments as illustrated in FIG. 5. For each equal time segment, the slope of the output frequency curve is derived in part by fitting a straight line 601 to the output frequency curve 603 using the starting and ending time points 605 and 607 of the segment as shown in FIG. 6.

Figure 7:
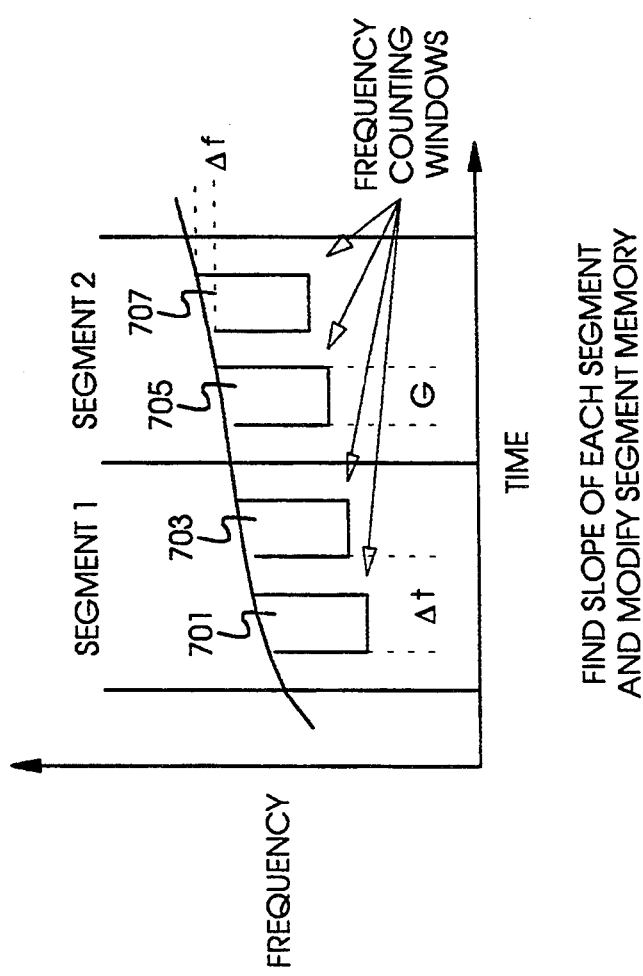
FIG. 7 is a graph diagram showing frequency counting windows in a modulation voltage curve segment compatible with the present invention.

After fitting the straight line 601 to the frequency curve 603, two frequency counting windows 701 and 703 for segment 1 (or 705 and 707 for segment 2), are typically used as shown in FIG. 7. The counting windows are gated to be of a time duration G, with a difference in time between the counting windows of $\Delta t$. The number of cycles of the VCO output frequency f are counted during the time duration G of each of the counting windows 701 and 703.

The following relationships are used to determine a value for $\Delta$count:

1. Average frequency is given by:

$$\bar{f_1} = \frac{\Delta f_1}{G}, \bar{f_2} = \frac{\Delta f_2}{G}$$

where G is the time value of a counting window.
2. count1 = $G\bar{f_1}$, count2 = $G\bar{f_2}$
3. $\Delta$count = count2 − count1 = $G(\bar{f_2} - \bar{f_1})$ 4. slope = $\frac{\bar{f_2} - \bar{f_1}}{\Delta t}$ 5. $\bar{f_2} - \bar{f_1}$ = slope $\Delta t$
6. $\Delta$count = slope $\Delta t \times G$ For every time segment during the sweep, there is a $\Delta$count value which represents an ideal slope. The actual $\Delta$count value is compared with the ideal $\Delta$count value to generate a correction value to adjust the digital control value for the appropriate segment upward or downward, thereby causing the VCO to produce the idealized linear modulation ramp output slope over time.

Figure 8:
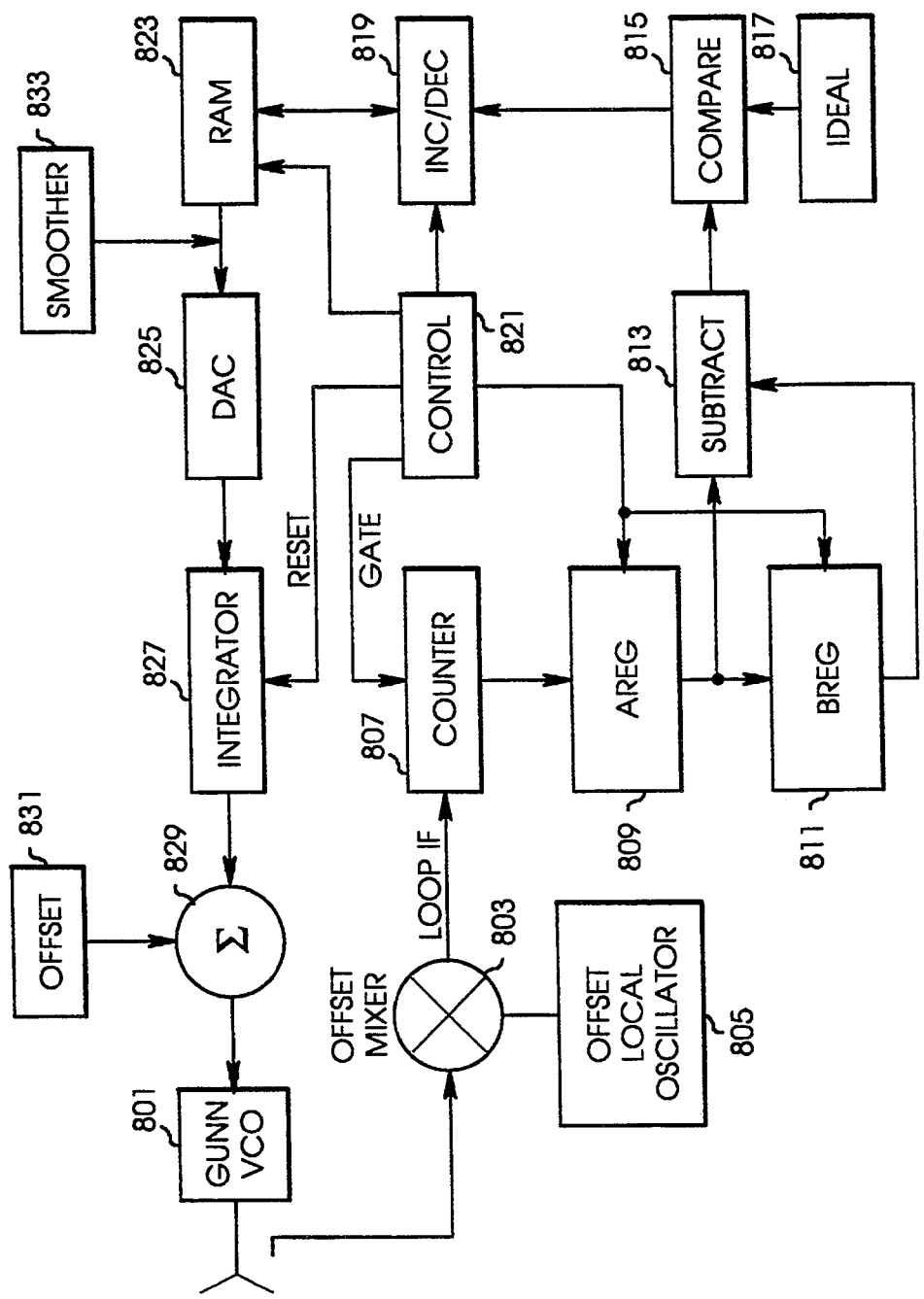
FIG. 8 is a block diagram showing the high level architecture of a closed loop linearizer compatible with the present invention.

FIG. 8 illustrates a preferred DDM implementing the present invention. The frequency output from a VCO 801 is fed into an offset mixer 803 which subtracts an offset value generated by an oscillator 805. While the mixer lowers the frequency and simplifies the resulting circuitry, it will be recognized that the mixer is not integral to the inventive aspect of the present invention and other embodiments without the mixer may be implemented without loss of generality. A counter 807 then counts the number of frequency cycles occurring during first and second frequency counting windows for each time segment, as gated and cleared by a control unit 821. Values for the first and second counting windows are stored in two registers 809 and 811. The difference between the count values stored in registers 809 and 811 is determined by subtractor 813, and the result is passed to a comparator 815 which compares the passed difference between the count values with a predetermined value stored at 817. The comparator 815 then passes the comparison information to an increment/decrement unit 819 which generates a value to add or subtract to the digital control value stored in memory 823. The resulting digital control values are converted to an analog signal by a DAC 825 which is converted to a smoothly varying analog signal by integrator 827. The smoothed analog signal is then sent to summing amplifier 829 which adds an offset 831 corresponding to the offset required to operate the VCO 801 at the desired frequency rate. The resulting signal is then sent as the control signal to the VCO 801. It will be recognized that other means may be substituted for the digital registers, subtractor, comparator, increment/decrement unit, and other components described above without loss of generality. For instance, preferred individual components described above may be combined into one component such as an application specific integrated circuit (ASIC), program array logic (PAL), or other such device as is well-known in the industry.

The preferred DDM implements a closed loop linearizer that produces a linear ramp modulation from the VCO by monitoring the output of the VCO, comparing the observed VCO output to an idealized output, and adjusting the digital control values accordingly in order to cause the VCO to produce the desired idealized output.

The present invention is to be limited only in accordance with the scope of the appended claims, since others skilled in the art may devise other embodiments still within the limits of the claims.

What is claimed is:

1. A linearizer apparatus for providing a linear ramp modulation for a voltage controlled oscillator (VCO), the apparatus comprising:
    (a) counter means connected to the VCO for calculating two or more frequency values of the oscillator at one or more time points during a ramp interval;
    (b) comparison means connected to the counter means for comparing the difference of at least two frequency values with that of a predetermined value, wherein the predetermined value represents an ideal difference frequency value, and for outputting a resulting correction value; and
    (c) adjustment means connected to the comparison means for adjusting digital control values upward and downward according to the correction value, thereby causing the VCO to produce a linear modulation ramp output slope over time.

2. The linearizer apparatus of claim 1, wherein the apparatus further comprises mixer means connected to the VCO for reading a radio frequency, subtracting a predetermined lower offset value and outputting a resulting down-converted radio frequency to the counter means.

3. The linearizer apparatus of claim 1, wherein the apparatus further comprises register means connected to the counter means for storing at least two frequency values.

4. The linearizer apparatus of claim 3, wherein the apparatus further comprises subtraction means connected to the register means for subtracting a first frequency value from a second frequency value and for outputting a resulting frequency difference value.

5. The linearizer apparatus of claim 4, wherein the comparison means is connected to the subtraction means and further comprises means for comparing the frequency difference value with that of a predetermined ideal slope value, the comparison means also comprising means for outputting a resulting comparison value.

6. The linearizer apparatus of claim 1, wherein the adjustment means causes the VCO to produce a linear modulation radio frequency slope over time for a varactor tuned radar.

7. A linearizer apparatus for providing a linear ramp modulation for a voltage controlled oscillator (VCO), the apparatus comprising:
   (a) counter means connected to the VCO for calculating at least two frequency values of the oscillator at one or more time points during a ramp interval;
   (b) register means connected to the counter means for storing at least a first and a second frequency value;
   (c) subtraction means connected to the register means for subtracting the first frequency value from the second frequency value and for outputting a resulting frequency difference value;
   (d) comparison means connected to the subtraction means for comparing the frequency difference value with that of a predetermined ideal difference frequency value, and for outputting a resulting comparison value; and
   (e) adjustment means connected to the comparison means for adjusting digital control values upward and downward according to the comparison value, thereby causing the VCO to produce a linear modulation ramp output slope over time.

8. The linearizer apparatus of claim 7, wherein the apparatus further comprises mixer means connected to the VCO for reading a radio frequency, subtracting a predetermined lower offset value and outputting a resulting down-converted radio frequency.

9. The linearizer apparatus of claim 7, wherein the adjustment means causes the VCO to produce a linear modulation radio frequency slope over time for a varactor tuned radar.

10. A linearizer apparatus for providing a linear ramp modulation for a voltage controlled oscillator (VCO), the apparatus comprising:
   (a) mixer means connected to the VCO for reading a radio frequency, subtracting a predetermined lower offset value and outputting a resulting down-converted radio frequency;
   (b) counter means connected to the mixer means for calculating a first frequency value of the down-converted radio frequency at a first time point during a radar sweep interval, and for calculating a second frequency value of the down-converted radio frequency at a second time point during the radar sweep interval;
   (c) register means connected to the counter means for storing the first and second frequency values;
   (d) subtraction means connected to the register means for subtracting the first frequency value from the second frequency value and for outputting a resulting frequency difference value;
   (e) comparison means connected to the subtraction means for comparing the frequency difference value with that of a predetermined ideal frequency slope value, and for outputting a resulting comparison value; and
   (f) adjustment means connected to the comparison means for adjusting digital control values upward and downward according to the comparison value, thereby causing the VCO to produce a linear modulation ramp output slope over time.

11. The linearizer apparatus of claim 10, wherein the adjustment means further comprises:
   (a) increment means connected to the comparison means for increasing and decreasing digital control values according to the comparison value;
   (b) random access memory (RAM) means connected to the increment means for storing the digital control values;
   (c) digital to analog conversion (DAC) means connected to the RAM means for reading the stored digital control values from the RAM means and converting them to an analog signal;
   (d) integration means connected to the DAC means for integrating the analog signal, resulting in a smoothly varying analog signal; and
   (e) summation means connected to the integration means for adding a predetermined offset to the smoothly varying analog signal and outputting a resulting control voltage to the VCO.

12. The linearizer apparatus of claim 11, wherein the adjustment means causes the VCO to produce a linear modulation radio frequency slope over time for a varactor tuned radar.

* * * * *